(12) United States Patent
Ehnholm et al.

(10) Patent No.: US 6,366,092 B1
(45) Date of Patent: Apr. 2, 2002

(54) MAGNETIC RESONANCE IMAGING (75) Inventors: Gosta J Ehnholm, Helsinki (FI); Ian Robert Young, Marlborough (GB)

(73) Assignee: Picker International, Inc., Cleveland, OH (US)

( * ) Notice: Subject to any disclaimer, the term of this patent is extended or adjusted under 35 U.S.C. 154(b) by 0 days.

(21) Appl. No.: 09/471,525

(22) Filed: Dec. 23, 1999

(30) Foreign Application Priority Data

Dec. 24, 1998 (GB) ................................. 9828428
Apr. 16, 1999 (GB) ................................. 9908600

(51) Int. Cl.[7] ................................. G01V 3/00
(52) U.S. Cl. .................. 324/309; 324/307; 324/300
(58) Field of Search .................. 324/309, 307, 324/318, 300

(56) References Cited

U.S. PATENT DOCUMENTS

| 4,733,183 A | | 3/1988 | Young ........................ 324/309 |
| 4,843,322 A | * | 6/1989 | Glover ........................ 324/309 |
| 5,031,624 A | * | 7/1991 | Mistretta et al. ............ 128/653 |
| 5,144,243 A | | 9/1992 | Nakabayashi et al. |
| 5,304,928 A | | 4/1994 | Takeda ........................ 324/300 |
| 5,910,728 A | | 6/1999 | Sodickson |

FOREIGN PATENT DOCUMENTS

WO   WO 98/21600   5/1998

OTHER PUBLICATIONS

Sodickson, et al.; "Simultaneous Acquisition of Spatial Harmonics (SMASH): Fast Imaging with Radiofrequency Coil Arrays"; MRM 38:591–603 (1997).
Porter, et al.; "A 16–Element Phased–Array Head Coil"; MRM 40:272–279 (1998).
Weaver; "Simultaneous Multislice Acquisition of MR Images"; MRM 8:275–284 (1988).
"Magnetic Resonance Method and Device"; Research Disclosure, Kenneth Mason Publications, Hampshire, GB, No. 391, Nov. 1, 1996.

* cited by examiner

Primary Examiner—Hezron Williams
Assistant Examiner—Brij B. Shrivastav
(74) Attorney, Agent, or Firm—John J. Fry (57) ABSTRACT

In magnetic resonance imaging apparatus having a resistive electromagnet with a bore 6, r.f. excitation pulse substantially simultaneously excites a number of slices A to D which are phase encoded and frequency encoded in the usual way, the direction of the main field being along the bore of the electromagnet in the direction z. The receive coil consists of an array of coils 5a to 5d which view different spatial regions of the imaging volume and the outputs of which are combined in different ways in order to reduce the number of slice encoding steps in the z-direction needed to distinguish between the slices A to D. Each coil of the array 5a etc. can form part of a two dimensional array in order to reduce the number of phase encoding steps in the phase encode direction.

24 Claims, 4 Drawing Sheets

SLICE SELECT AND SLICE ENCODE

FIG. 7c

PHASE ENCODE

FIG. 7d

FREQUENCY ENCODE

MAGNETIC RESONANCE IMAGING

BACKGROUND OF THE INVENTION

This invention relates to magnetic resonance imaging.

In magnetic resonance imaging, the subject to be imaged is positioned in a strong magnetic field, and magnetic resonant (MR) active nuclei such as protons in hydrogen atoms align parallel and anti-parallel to the magnetic field, precessing around the direction of the field at the Larmor frequency.

A transmit coil applies pulses of r.f. energy at the Larmor frequency in a direction orthogonal to the main field to excite precessing nuclei to resonance, which results in the net magnetisation of all MR active nuclei being flipped from the direction of the main magnetic field into a direction having a transverse component in which it can be detected by the use of a receive coil.

The received signal can be spatially encoded to produce two dimensional information about the distribution of MR active nuclei and hence of water and tissue.

Figure 1:
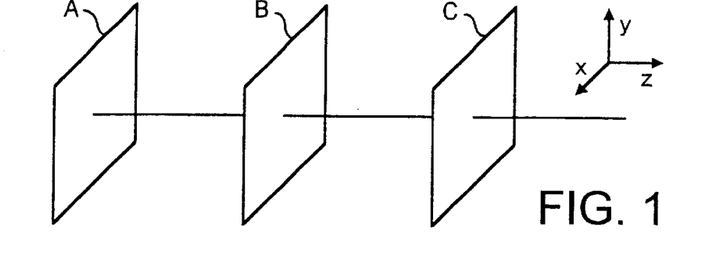
FIG. 1 is a schematic representation of known multi-slice imaging with the slice selection gradient along the z-axis.

Referring to FIG. 1, the main field is in the direction of the z-axis, and the strength of the magnetic field is made to vary along the direction of the z-axis by switching on z-gradient coils. The Larmor frequency of MR active nuclei will then also vary along the z-axis, and excitation can be confined to a slice such as slice A by appropriate choice of the bandwidth of the r.f. pulse.

Spatial information within the plane of the slice can be obtained by reading out the signals picked up by the receive coil in the presence of a gradient which varies e.g. in the y-direction, and by turning on and turning off a gradient in the orthogonal direction (in this case the x-direction) before the readout for a number of different increments of gradient strength and polarity in order to phase encode the received signal in that direction.

There are many occasions e.g. imaging the brain of a patient, when it is desired to produce information on several slices A, B, C etc. in which case the procedure outlined for slice A is repeated for slice B and then for slice C etc.

The signal picked up by the receive coil (the free induction decay—FID signal) could appear after as little as a very few ms (e.g. 2 to 3 ms) after the r.f. excitation pulse, and the collection of data corresponding to one r.f. pulse, including time for application of gradients and signal conditioning, could be as little as 5 to 6 ms. However, a desired repetition time (TR) at which the longitudinal and transverse components of magnetisation could have recovered to values necessary to produce a desired contrast could be 200 ms or much longer (up to a few seconds). Therefore, if TR were to be chosen as 40 ms, a FID signal at a first phase encode increment would be collected from slice A, and 40 ms later a second FID signal at a first phase encode increment would be collected from slice B. After five slices, an FID signal of a second phase encode increment would be collected from slice A.

In the case of a lower power magnet, a satisfactory signal-to-noise ratio might be produced only by completing the scanning procedure for all phase encode increments for all slices, and then repeating the data collection procedure a number of times.

To increase the signal-to-noise ratio without repetitions, or with a reduced number of repetitions, a technique is available for exciting a number of slices e.g. four, simultaneously, using only one r.f. pulse which behaves like four separate r.f. pulses of frequencies corresponding to the four slices in the presence of a3 magnetic field gradient, so that four times as much information can be collected after each r.f. pulse.

Of course, each FID signal collected would now relate to four slices, and the slices would have to be distinguished between in one way or another. One possible way would be to vary the r.f. phase so that e.g. on one excitation the r.f. pulse corresponding to one slice was in anti-phase compared to that corresponding to another. This set of data could then be identified from the signal after another excitation in which all were in the same phase. Permutating and combining such phase changes permits identification of the individual signals from the separate slices.

Another way of distinguishing between the slices would be to apply an additional slice encoding gradient. After each r.f. pulse, another gradient in the z-direction could be turned on and off before readout of the FID signals. For each phase encode gradient in the plane of the slices, a series of slice encode gradients would be applied over a range of gradient strengths and polarities.

While a useful amount of information is collected after each r.f. pulse in the interests of good signal-to-noise ratio, the time taken for such a data collection procedure increases.

The Applicants have appreciated that the time taken for data collection necessitated by slice encoding can be reduced by the application of a technique which has been proposed for phase encoding in the image plane.

This technique is referred to as Simultaneous Acquisition of Spatial Harmonics (SMASH): Fast Imaging with Radio Frequency Coil Arrays, Daniel K Sodickson, Warren J Manning, MRM 38:591–603 (1997) and WO-A-98/21600.

It will be recalled that the purpose of phase encoding e.g. in the x-direction in FIG. 1, is to have some means of distinguishing the contributions to the FID signal from precessing protons at various points along the x-axis. To do this, a gradient in the x-direction is turned on and turned off, creating a phase difference between the precessing protons at different points along the x-axis, before the readout takes place. A series of gradients are in fact applied, and the detected signals can be processed to sort out the locations of the precessing protons which contributed to the received signal. (The readout gradient resolves the contributions from the protons in the y-direction).

Figure 2:
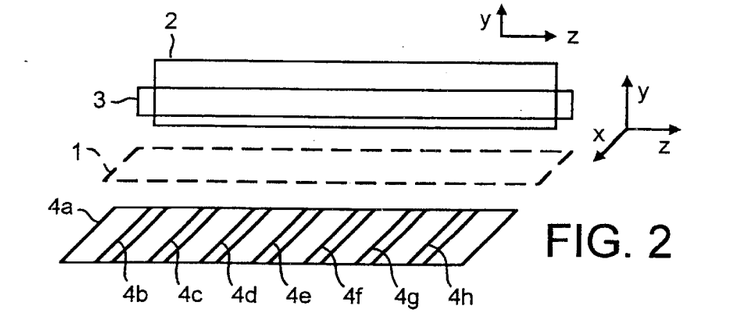
FIG. 2 is a schematic representation of a known saggital imaging of a spine, both with a single receive coil and with an array of receive coils.

Referring to FIG. 2, consider for example a coil 1 (shown dotted) for producing a saggital (vertical longitudinal) section 2 through a spine 3. In this case, the direction of the main magnetic field is along the z-axis, and the slices such as 2 are frequency selected by a magnetic field gradient along the x-axis. The slice 2 is spatially encoded by phase encoding in the z-direction and frequency encoding in the y-direction. A series of gradients in the z-direction are turned on and turned off before the FID signal is detected to accomplish phase encoding.

At each gradient, a phase difference will be generated between protons precessing at the same frequency but located at different positions along the length of the spine. Once this is done, it is possible to calculate the contribution to the FID signal from different positions along the length of the spine.

Figure 3A:
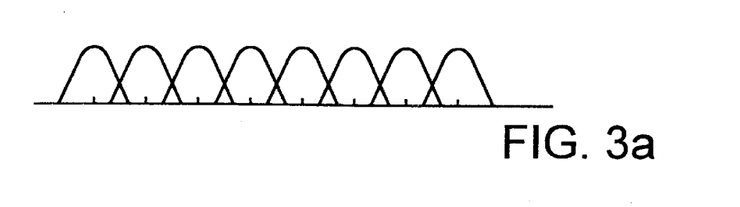
FIG. 3a shows the amplitude response of the individual coils of the array of FIG. 2.

The SMASH technique refers to an array of overlapping coils 4a, 4b, 4c, 4d, 4e, 4f, 4g, 4h instead of one large coil 1. Each coil of the array now only views part of the region being imaged. The response patterns of the individual coils are shown in FIG. 3a.

Figure 3B:
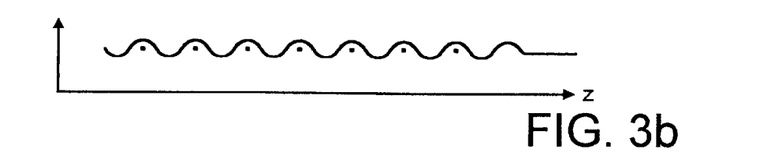
FIG. 3b shows the response of the array when summed in a zero order combination.
Figure 4A:
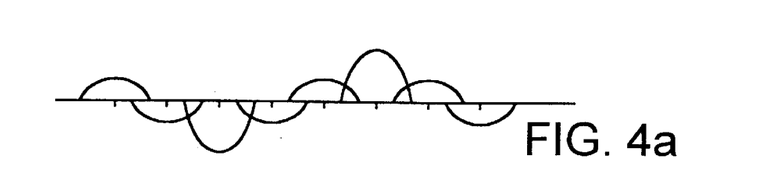
FIG. 4a shows the amplitude response of individual coils scaled and with polarity appropriate for one combination.
Figure 4B:
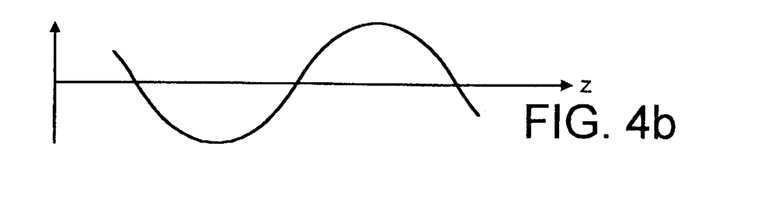

If the outputs of the individual coils of the array are summed, the response is as shown in FIG. 3b, and is similar to that of the conventional single coil. If the full amplitude output of the coil f is summed with the outputs of coils b, g, and e at reduced amplitudes, and the output of coil c and, with reduced amplitude, of coils b, d, and h are subtracted, the overall response of the coils will be such as to create a phase difference in the z-direction, as shown in FIG. 4b. Thus, the FID signal will be different as regard to the contributions of protons precessing in phase located at the ends of the spine and the middle of the spine. The array corresponds to about one and a half cycles when combined in this way. If the array corresponded to one whole cycle, the response would be first order, etc.

Figure 5A:
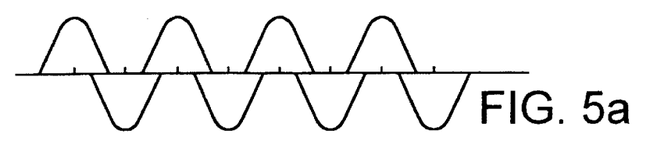
FIG. 5a shows the amplitude response of individual coils scaled and with polarity appropriate for a higher order combination.
Figure 5B:
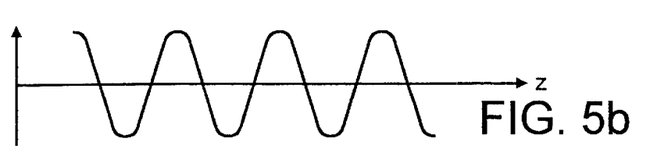
FIG. 5b shows the response of the higher order combination.

The outputs of the coils of the array can be combined by alternately summing and subtracting them to produce a higher order response as shown in FIG. 5b.

The SMASH technique thus partially replaces gradient phase encoding in the plane of the slice 2 by a spatial encoding procedure that relies on the fact that the coils of the array are sensitive to different parts of the volume to be imaged. Different combinations of the outputs of those coils produce amplitude modulation of the FID signal received along one axis of the slice, whereas conventional phase encoding modulates the FID signal along that axis by applying different magnetic field gradients to produce different phase shifts.

An advantage of the SMASH technique is that two or more output combinations can be processed in parallel for any applied phase encoding gradient, thus reducing the number of phase encoding gradient steps required and speeding up the collection of data.

Nevertheless, the SMASH technique only contemplates arranging the coil array to encode the MR signals in the image plane.

SUMMARY OF THE INVENTION

The invention provides magnetic resonance imaging apparatus comprising means for imparting a gradient to the main magnetic field of the apparatus, r.f. means for exciting nuclear magnetic resonance substantially simultaneously in a plurality of slices orthogonal to the direction of the gradient in a region to be imaged, an array of receiving coils for collecting the data from the excited slices, and means for processing the collected data using different combinations of the signals from the individual coils for slice encoding purposes, in order to produce two dimensional real images of the slices.

The slices may be separated along the direction of the magnetic field gradient, or they may be contiguous, in which case the end result is a volumetric image.

The invention will now be described in greater detail by way of example with reference to the accompanying drawings, in which:

The present invention provides the foregoing and other features hereinafter described and particularly pointed out in the claims. The following description and accompanying drawings set forth certain illustrative embodiments of the invention. It is to be appreciated that different embodiments of the invention may take form in various components and arrangements of components. These described embodiments being indicative of but a few of the various ways in which the principles of the invention may be employed. The drawings are only for the purpose of illustrating a preferred embodiment and are not to be construed as limiting the invention.

BRIEF DESCRIPTION OF THE DRAWINGS

The foregoing and other features and advantages of the present invention will become apparent to those skilled in the art to which the present invention relates upon consideration of the following detailed description of a preferred embodiment of the invention with reference to the accompanying drawings, wherein:

FIG. 4b shows the response corresponding to FIG. 4a;

FIG. 13a shows an uncorrected single line profile through the magnitude image acquired by a coil; and FIG. 13b shows a corrected single line profile through the magnitude image acquired by the coil represented in FIG. 13a.

DETAILED DESCRIPTION

Figure 6:
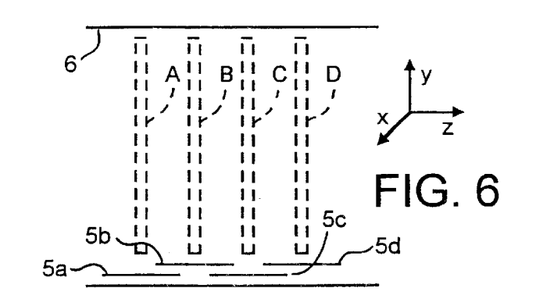
FIG. 6 is a schematic representation of the multi-slice imaging apparatus according to the invention showing the location of the receive coil array.

Referring to FIG. 6, the magnetic resonance imaging apparatus of the invention consists of an electromagnet of the resistive kind (not shown), having a main field along the z-axis within an internal bore 6, although the invention is applicable to superconducting electromagnets and other types of magnet as well. In addition, the magnetic resonance imaging apparatus is provided with x, y and z-gradient coils (not shown). The z-gradient coil produces a magnetic field gradient in the z-direction which, in conjunction with the r.f. transmit coil (not shown) is responsible for simultaneously energising four slices of a region of interest of a patient located within the bore 6 of the electromagnet, assuming the slices are being selected transversely i.e. to lie in the x,y plane. The z-gradient coil produces magnetic field gradients in the z-direction (the first part of the slice select and slice encode gradient shown in FIG. 7c). The effect of the single r.f. pulse (FIG. 7a) produced by an r.f. transmit coil (not shown) in conjunction with this z-gradient is to excite substantially simultaneously four slices A, B, C, D, producing the same effect as if four r.f. pulses, each frequency offset from each other, were simultaneously applied. There are actually slight timing differences between one slice and another in order to minimise power deposition, but these are small compared with the duration of the pulses. Of the total pulse duration, a typical variation between one slice and the next would be 10% of that total.

Figure 7A:
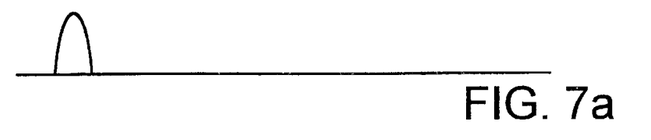
FIG. 7a represents a typical r.f. excitation pulse.
Figure 7B:
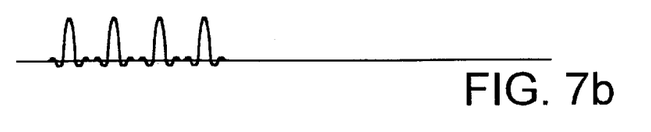
FIG. 7b represents the pulses effectively applied in the presence of a magnetic field gradient by the r.f. pulse of FIG. 7a, shown for clarity with much less overlap than would be used in practice.

Note that for the purposes of illustration, these four simultaneous pulses are shown spaced apart in FIG. 7b, but the horizontal axes of FIG. 7a to 7e otherwise represent time. These slices are orthogonal to the z-axis.

Figure 7C:
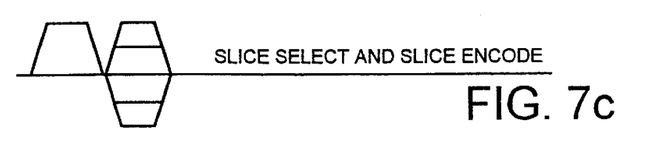
FIG. 7c shows the slice select gradients and slice encode gradients.
Figure 7D:
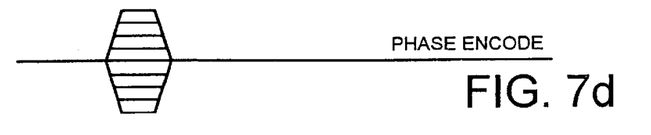
FIG. 7d shows the phase encode gradients.
Figure 7E:
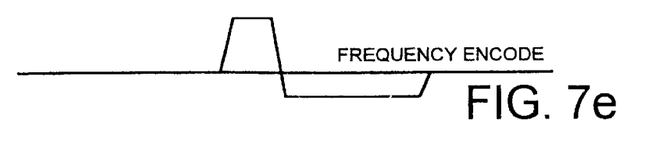
FIG. 7e shows the frequency encode gradient.

The y-gradient coils are provided for spatially encoding the imaged slices in the y-direction, by applying the frequency encode gradient shown in FIG. 7e when the FID signal is received in a receive coil following excitation by the r.f. pulse shown schematically in FIG. 7a. The gradient of FIG. 7e includes a rephase portion of opposite polarity to the read portion, although the amplitude of the two portions can vary. Phase encoding in the x-direction is produced by means of an x-gradient coil which steps through a number of increasing values of both polarity, as shown schematically in FIG. 7d. This gradient is turned on and off after the r.f. excitation pulse and before the readout of the FID signal during the frequency encode gradient. An excitation pulse (FIG. 7a) may be generated for each increment of the phase encode gradient and the FID signal read out when the frequency encode gradient is applied. This procedure may be repeated for each increment of phase encode gradient. The method is also applicable to multi-echo methods such as fast spin echo and gradient recalled echos such as echo planar imaging (EPI).

As described thus far, the magnetic resonance imaging apparatus is already known, and the value of simultaneously exciting the four slices A, B, C, D, is that four times as much information can be collected for each excitation pulse compared to the situation where only one slice at a time was excited by the r.f. pulse. A possible repetition time would be 200 ms and a possible time for collection of the FID signal would be 40 ms, so four other groups of four slices could be excited before returning to the slices described.

Previously, for each phase encode increment in the direction x, to distinguish between the slices A, B, C, D, it would have been necessary to apply an increment of a separate phase encode gradient in the z-direction, by turning on and turning off this gradient (the second lobe of the slice select and slice encode gradient—FIG. 7c), between the r.f. excitation pulse and readout, and this would have meant that the data collection took a long time.

In accordance with the invention, the receive coil consists of an array of coils 5a, 5b, 5c, 5d, the outputs of which are simultaneously combined in different ways at the same time as slice encode gradients are applied (FIG. 7c). Because of these multiple signals from the coil array 5a to 5d, there are considerably less slice encode gradients than would hitherto have been necessary. Typical numbers of coils 5a etc. would be in the range of from 4 to 8, preferably 8 in the case discussed here to minimise artifacts due to the sensitive volume of a coil including too much signal from a region from which zero sensitivity is desirable. With four coils, the number of phase increments in the slice select direction may be reduced by a factor of four, and with eight coils, the number of phase increments in the slice select direction may be reduced by a higher factor, say, five or six.

Thus, data is collected in the following way. An excitation pulse is applied and the four slices A to D are simultaneously excited. One increment of the phase encode gradient is turned on and turned off, and the FID signal is read out with the frequency encode gradient applied. This procedure takes place at a first increment of the slice encode gradient. The procedure is repeated now at a second increment of the slice encode gradient. The procedure is repeated until all the increments of the slice encode gradient are stepped through, whereupon a second increment of the phase encode gradient is applied, and the slice encode gradients are again stepped through. For each data acquisition at an increment of the slice encode gradient, two or more separate combinations of the outputs of the array coils 5a to 5d are produced. These may be for the zeroth order, the first order and the second order (corresponding to a flat response along the array, one cycle along the array, two cycles along the array, respectively). Each data acquisition therefore produces more than one line of k-space, and an array of k-space data is built up for each slice A, B, C, D. These are then Fourier transformed to form real two dimensional images of the four slices in the usual way. However, the processing of data can take advantage of any of the techniques used for SMASH processing as described in the prior art referred to.

Figure 8:
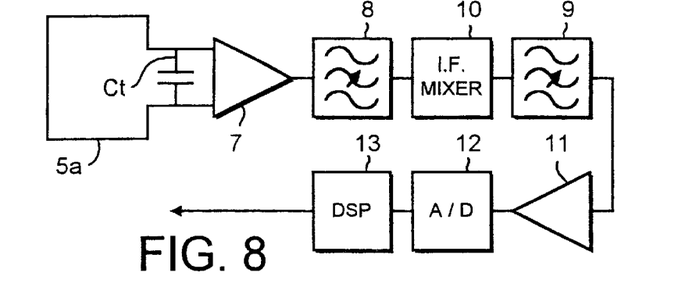
FIG. 8 shows processing electronics connected to a typical coil of the array.

Each coil 5a etc. is typically rectangular (FIG. 8) and the coils are overlapped to reduce mutual inductance between them. Referring to FIG. 8, each coil has a tuning capacitor Ct connected across it, the output of which is amplified in preamplifier 7 and mixed to an IF frequency in IF mixer 10, being bandpass filtered 8,9 before and after. The signal is then amplified in amplifier 11 and digitised in analogue-to-digital converter 12 which feeds digital signal processor 13 which performs a buffering function and in which decimation takes place. The output then passes to a computer bus. A further processor (not shown) combines the outputs of the coils in the ways described. The amplitude and phases of the outputs of the coils are adjusted so that the array of coils produces overall sensitivity patterns which correspond to the various spatial frequencies some of which are shown in FIGS. 3b, 4b and 5b. K-space data is acquired, and Fourier Transformation takes place to produce real images of the slice.

The coils are such that their sensitive volumes are desirably Gaussian or Quasi-Gaussian. The basis restriction on the coils involves ensuring that the fields of view of the coils do not extend too far, since generation of the desirable profile patterns becomes more difficult.

Figure 10:
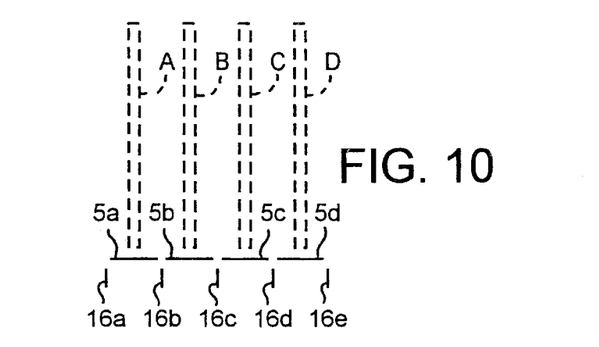
FIG. 10 shows a second alternative form for the receive coil array for the apparatus of FIG. 6.

A modification is shown in FIG. 10. In order to achieve the object of ensuring that fields of view of the coils do not extend too far, the coils may be of lesser dimension along the z-axis with the result that they then do not overlap. This would result in significant mutual inductance between the coils of the array which would be undesirable. To avoid this, shields 16a to 16e are provided, and this reduces the mutual inductance between the array coils 5a to 5d. The shields are loops tuned to the same frequency as the coils 5a to 5d, and are shown in FIG. 10 at right angles to the plane of the drawing. The shield loops have tuning capacitors, which are tuned as a set with the respective array coils. The shield loops do not have to connect to any part of the circuit of FIG. 8.

Figure 9:
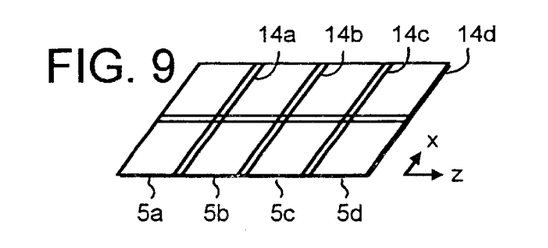
FIG. 9 shows an alternative form of the receive coil array for the apparatus of FIG. 6.

Referring to FIG. 9, it is not necessary for there to be a single set of coils 5a to 5d in a linear direction. A plurality of further sets, only one of which 14a to 14d is shown, can also be provided extending in the x-direction. More than two sets are required in practice. The further sets are also overlapped in the z-direction, but are also overlapped as well in the x-direction, again, to avoid mutual coupling between the coils. The outputs of coils 5a, 14a etc. are combined in different ways using the SMASH technique to reduce the number of phase encoding gradients, thereby combining the advantages of the invention with the phase encode advantage of SMASH.

Figure 11:
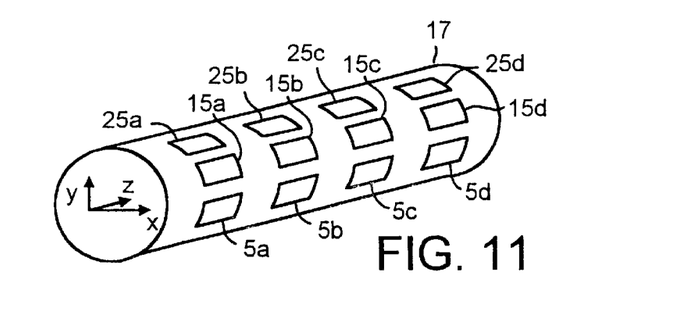
FIG. 11 shows a third alternative form of the receive coil array for the apparatus of FIG. 6.

According to a further modification, the two dimensional array of coils of FIG. 9 may be wrapped around the bore 6 (FIG. 11). As before the coils 5a to 5d extend in the z-direction, but now each coil performs part of an array extended in the circumferential direction i.e. 5a, 15a, 25a, 5b, 15b, 25b, etc. The sets would extend right around the circumference of the former 17 on which they are mounted, but this is not shown in the drawing for simplicity. The advantage of this is again to dispense with some of the phase encode increments (FIG. 7d) in the same way as for FIG. 9. In the present case, however, the coils used for reducing the phase encode gradient steps extend in the peripheral direction rather than in a straight line. The outputs of the coils 5a, 15a, 25a, etc. are combined in different ways to produce various spatial sensitivities e.g. those shown in FIGS. 3b, 4b, 5b, to increase the speed of the processing. The processing of the arrays 5a to 5d etc. in the z-direction remains as before. The x,y gradients would be combined to produce magnetic field gradients of the required orientations.

In an example of the present invention, another approach relies on the use of a multi-coil array to provide unique sensitivity information for each slice position. The resultant mixed slice images are untangled using matrix algebra to solve a set of simultaneous linear equations.

While the example which follows relates to four slices, for example, as illustrated in the embodiments of FIGS. 6 and 10, the method is generally applicable to n coils and n slices. The method resolves simultaneously excited slices providing there is a minimum of the same number of coils as slices and each coil has a different sensitivity to any given slice. This sensitivity is spatially dependent and for n slices and n coils the total complex signal acquired in coil 1 in a single pixel ($C_1$) is given by the equation:

$$S_{11}x_1 + S_{12}x_2 + S_{13}x_3 \ldots + S_{1n}x_n = C_1 \qquad \text{Equation 1}$$

where Sij is the complex sensitivity of coil i to slice j, xj is the spatially dependent complex signal from slice j, and C is defined above. Similar expressions for the other coils can be constructed leading to the soluble set of equations expressed in matrix form:

$$\begin{bmatrix} S_{11} & S_{12} & S_{13} & \ldots & S_{1n} \\ S_{21} & S_{22} & S_{23} & \ldots & S_{24} \\ S_{31} & S_{32} & S_{33} & \ldots & S_{34} \\ \vdots & \vdots & \vdots & & \vdots \\ S_{n1} & S_{n2} & S_{n3} & \ldots & S_{nn} \end{bmatrix} \cdot \begin{bmatrix} x_1 \\ x_2 \\ x_3 \\ \vdots \\ x_n \end{bmatrix} = \begin{bmatrix} C_1 \\ C_2 \\ C_3 \\ \vdots \\ C_n \end{bmatrix} \qquad \text{Equation 2}$$

and in shorthand notation:

$$[S] \cdot [x] = [C] \qquad \text{Equation 3}$$

The solution for [x] is given by:

$$[x] = [S]^{-1} \cdot [C] \qquad \text{Equation 4}$$

where $[S]^{-1}$ is the inverse of the complex sensitivity matrix [S]. The set of complex matrices [x] holds the MR signal at each pixel for each slice.

A multi-slice excitation was achieved (using for example the apparatus of FIG. 6 or 10) by appropriate modification of a standard sinc profiled pulse, such that a discrete set of slices could be excited. This work was performed with a four-slice excitation and a four receive coil linear spine array. The slice positions were not commensurate with the coil spacing as this is not a methodological requirement.

The complex sensitivity matrix was generated empirically from four acquisitions. Each acquisition excited a single transverse slice in a large uniform phantom, one at each of the four positions at which the multi-slice excitation operated. These data then contain the sensitivity of each coil to a single slice at each position and this information provides the complex 4×4 array ([S] above) for each pixel within the area covered by the uniform phantom. These data need only be acquired once for a given geometry of coils and slices.

Full simultaneous four slice data was acquired with four cylindrical samples one placed at each of the four slice positions.

The inverse complex sensitivity matrix for each pixel was calculated using Gaussian elimination. This and all other image manipulation was performed using IDL (Research Systems, Colorado) running on a DEC Alpha workstation.

All imaging was performed on a .05T Picker Asset scanner. The sensitivity matrix acquisitions and imaging acquisitions were all simple gradient echo sequences with 128×256 matrix, field of view 26 cm, TR/TE 8.1/400 and 2 sample averages, total acquisition time 102 s.

Figure 12:
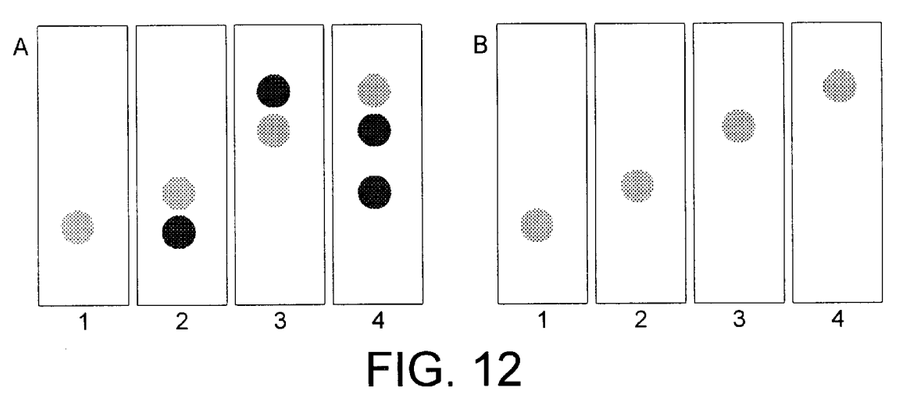
FIG. 12a shows uncorrected magnitude images of test phantoms from a four slice simultaneously acquired data set from four coils.
FIG. 12b shows pixel by pixel corrected magnitude images corresponding to FIG. 12a for four coils.
Figure 13:
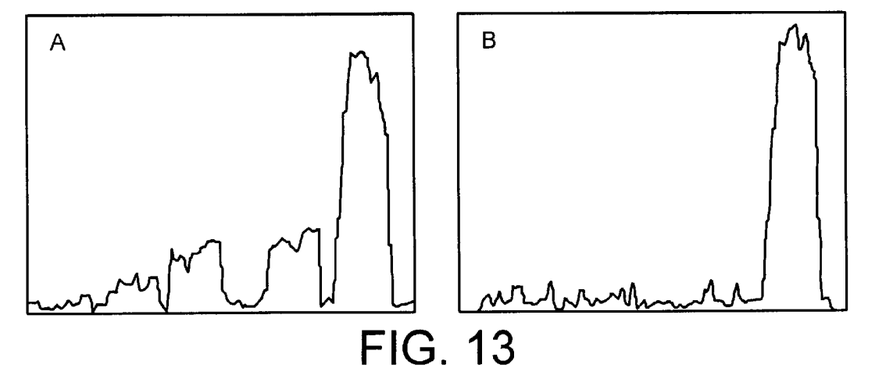

Uncorrected magnitude images of the test phantoms from a four slice simultaneously acquired data set can be seen in FIG. 12A, (coils 1–4). Pixel by pixel corrected magnitude images are shown in FIG. 12B (coils 1–4). The uncorrected images (FIG. 12A) show the mixed data (the magnitude of array [C] and the corrected images (FIG. 12B) have appropriately redistributed data (magnitude of array [x]). Both sets of images have been windowed and levelled in the same way. FIGS. 13A and 13B shows a single line profile through the magnitude image acquired by coil 4, FIG. 13A, before correction and FIG. 13B, after correction.

The application of this technique for resolving four slice images with a four-coil array has been demonstrated. For n coils the principle holds for $\leq n$ slices. The limitation is that each coil must have sufficiently different complex sensitivity to each slice for the matrix equation 3 not to become ill-conditioned. As an alternative to obtaining the sensitivity using phantoms at each slice position in turn, the sensitivity can be obtained by mapping the whole volume of coil sensitivity. Once this is done oblique slices in any orientation which satisfy the above criteria can be resolved assuming the coil geometry is fixed.

Signal to noise in such processing is critically dependent on the noise in the array sensitive matrix [S]. Zero noise in [S] means the pure combination of uncorrelated noise with correlated signal, which would produce a net improvement in SNR. In reality as [S] is obtained empirically there will be noise and this contributes to error in the corrected data.

The principle application of the technique lies in the factor of n saving acquisition time for n slices. Contrast enhanced dynamic scanning, where temporal resolution is paramount, would benefit directly from such an approach. Spine imaging where arrays are routinely used would again benefit by shorter total acquisition times.

Of course there is no need for the array to be restricted to four coils in length, for example more than four e.g. eight coils may be used. Equally, there is no restriction as to the number of coils in the peripheral direction or in the flat array of FIG. 9. While the coils are shown as being not overlapped in FIG. 11, they could be overlapped, or shielding coils could be used. Shielding coils could be used in the FIG. 9 embodiment.

There is no need for the slices excited to be perpendicular to the z-axis; they could be perpendicular to the x or y axes, or be oblique.

There is no need for four slices to be excited simultaneously in the z-direction. A larger or smaller number of slices may be simultaneously excited. Nor is there need for the slices A to D to be spaced apart, they could be contiguous, with the result that the imaging apparatus produces a quasi-volumetric image.

While a particular feature of the invention may have been described above with respect to only one of the illustrated embodiments, such features may be combined with one or more other features of other embodiments, as may be desired and advantageous for any given particular application. From the above description of the invention, those skilled in the art will perceive improvements, changes and modification. Such improvements, changes and modification within the skill of the art are intended to be covered by the appended claims.

What is claimed is:

1. A magnetic resonance imaging apparatus comprising:
   means for imparting a slice-encode gradient to a main magnetic field of the apparatus, the slice-encode gradient having a plurality of slice-encode gradient increments;
   radio frequency means for exciting nuclear magnetic resonance substantially simultaneously in a plurality of slices orthogonal to the direction of the gradient in a region to be imaged;
   an array of receiving coils for collecting the data from the excited slices; and
   means for processing the collected data using different combinations of the signals from the individual coils wherein a plurality of k-space lines are generated for each slice-encode gradient increment.

2. The magnetic resonance imaging apparatus of claim 1 wherein the receiving coils are overlapped in the direction of the gradient.

3. The magnetic resonance imaging apparatus of claim 1 wherein the receiving coils are separated from each other by shields.

4. The magnetic resonance imaging apparatus of claim 3 wherein the shields are loops tuned to the same frequency as the coils.

5. The magnetic resonance imaging apparatus of claim 1 wherein the slices are spaced apart from each other in the direction of the gradient.

6. The magnetic resonance imaging apparatus one of claim 1 wherein the slices are contiguous to form a volumetric image.

7. The magnetic resonance imaging apparatus of claim 6 wherein each coil of the array forms part of a further array in the phase encoding direction.

8. The magnetic resonance imaging apparatus of claim 7 wherein the array is arranged in a sleeve-like formation encompassing the imaging volume.

9. A method for magnetic resonance imaging, the method comprising the steps of:
   imparting a slice-encode gradient to the main magnetic field of a magnetic resonance imaging apparatus;
   exciting nuclear magnetic resonance with radio frequency signals substantially simultaneously in a plurality of slices orthogonal to the direction of the slice-encode gradient in a region to be imaged, the slice-encode gradient having a plurality of slice-encode gradient increments;
   collecting the data from the excited slices in an array of receiving coils;
   processing the collected data using different combinations of signals from individual coils in the array of coils wherein a plurality of k-space lines are generated for each slice-encode gradient increment; and
   producing real images of the plurality of slices from the processed data.

10. The method of magnetic resonance imaging of claim 9 including the step of shielding the receiving coils.

11. The method of magnetic resonance imaging of claim 10 including the step of tuning the shields to the same frequency as the receiving coils.

12. The method of magnetic resonance imaging of claim 9 wherein the step of processing the collected data includes the step of solving a set of simultaneous equations.

13. The method of magnetic resonance imaging of claim 9 wherein the step of processing includes applying slice encode gradients while combining the signals from the individual coils in the array of coils.

14. A magnetic resonance imaging apparatus, the apparatus comprising:
   a main field magnet;
   a gradient field coil assembly for applying a slice-encode gradient to the main field, the slice-encode gradient having a plurality of slice-encode gradient increments;
   a radio frequency coil for exciting nuclear magnetic resonance substantially simultaneously in a plurality of slices orthogonal to the direction of the slice-encode gradient in a region to be imaged;
   an array of receiving coils for collecting the data from the excited slices, each coil providing a signal; and
   a processor for collecting data using different combinations of the signals from the individual coils wherein a plurality of k-space lines are generated for each slice-encode encode gradient increment in order to produce real images of the plurality of slices.

15. The magnetic resonance imaging apparatus of claim 14 wherein the receiving coils are overlapped in the direction of the gradient.

16. The magnetic resonance imaging apparatus of claim 14 wherein the receiving coils are separated from each other by shields.

17. The magnetic resonance imaging apparatus of claim 16 wherein the shields are loops tuned to the same frequency as the coils.

18. The magnetic resonance imaging apparatus one of claim 14 wherein the slices are contiguous to form a volumetric image.

19. The magnetic resonance imaging apparatus of claim 18 wherein each coil of the array forms part of a further array in the phase encoding direction.

20. The magnetic resonance imaging apparatus of claim 19 wherein the array is arranged in a sleeve-like formation encompassing the imaging volume.

21. A magnetic resonance imaging apparatus comprising:
   means for imparting a gradient to a main magnetic field of the apparatus;
   radio frequency means for exciting nuclear magnetic resonance substantially simultaneously in a plurality of slices orthogonal to the direction of the gradient in a region to be imaged;

an array of receiving coils for collecting the data from the excited slices; and means for processing the collected data using different combinations of the signals from the individual coils for slice encoding purposes in order to produce real images of the slices;

wherein the receiving coils are separated from each other by shields; and wherein the shields are loops tuned to the same frequency as the coils.

22. A method for magnetic resonance imaging, the method comprising the steps of:

imparting a gradient to the main magnetic field of a magnetic resonance imaging apparatus;

exciting nuclear magnetic resonance with radio frequency signals substantially simultaneously in a plurality of slices orthogonal to the direction of the gradient in a region to be imaged;

collecting the data from the excited slices in an array of receiving coils;

processing the collected data using different combinations of signals from individual coils in the array of coils for slice encoding purposes;

producing real images of the plurality of slices from the processed data;

shielding the receiving coils; and tuning the shields to the same frequency as the receiving coils.

23. A magnetic resonance imaging apparatus, the apparatus comprising:

a main field magnet;

a gradient field coil assembly for applying a gradient to the main field;

a radio frequency coil for exciting nuclear magnetic resonance substantially simultaneously in a plurality of slices orthogonal to the direction of the gradient in a region to be imaged;

an array of receiving coils for collecting the data from the excited slices, each coil providing a signal; and a processor for collecting data using different combinations of the signals from the individual coils for slice encoding purposes in order to produce real images of the plurality of slices;

wherein each coil of the array forms part of a further array in the phase encoding direction.

24. The magnetic resonance imaging apparatus of claim 23 wherein the array is arranged in a sleeve-like formation encompassing the imaging volume.

* * * * *